United States Patent [19]

Goto et al.

[11] Patent Number: 5,304,326
[45] Date of Patent: Apr. 19, 1994

[54] THERMOPLASTIC ELASTOMER COMPOUNDS

[75] Inventors: Kohei Goto; Motokazu Takeuchi; Takumi Miyachi, all of Tokyo, Japan

[73] Assignee: Hyperion Catalysis International, Inc., Cambridge, Mass.

[21] Appl. No.: 995,916

[22] Filed: Dec. 17, 1992

Related U.S. Application Data

[63] Continuation of Ser. No. 511,780, Apr. 18, 1990, abandoned.

[30] Foreign Application Priority Data

Apr. 19, 1989 [JP] Japan .................. 1-99195

[51] Int. Cl.$^5$ .................... H01B 1/04; H01C 1/04
[52] U.S. Cl. .................... 252/511; 524/495; 524/496
[58] Field of Search ............ 252/511; 524/495, 496

[56] References Cited

U.S. PATENT DOCUMENTS

| | | | |
|---|---|---|---|
| 2,796,331 | 6/1957 | Kauffman et al. | 23/209.4 |
| 4,382,882 | 5/1983 | Vogel et al. | 252/503 |
| 4,461,719 | 7/1984 | Vogel et al. | 252/503 |
| 4,525,147 | 6/1985 | Pitz et al. | 433/224 |
| 4,533,685 | 8/1985 | Hudgin et al. | 523/457 |
| 4,565,683 | 1/1986 | Yates et al. | 423/447.3 |
| 4,572,813 | 2/1986 | Arakawa et al. | 264/29.2 |
| 4,663,230 | 5/1987 | Tennent et al. | 428/367 |
| 4,678,602 | 7/1987 | Taneka et al. | 252/511 |
| 4,748,436 | 5/1988 | Kanamori et al. | 338/214 |
| 4,816,289 | 3/1989 | Komatsu et al. | 423/447.3 |

FOREIGN PATENT DOCUMENTS

| | | |
|---|---|---|
| 0198558 | 10/1986 | European Pat. Off. |
| 56-088442 | 7/1981 | Japan . |
| 59-152299 | 8/1984 | Japan . |
| 61-132600 | 11/1984 | Japan . |
| 63-280786 | 5/1987 | Japan . |
| 63-286443 | 5/1987 | Japan . |
| 63-286468 | 5/1987 | Japan . |
| 62-505198 | 6/1988 | Japan . |
| 87/01317 | 10/1987 | PCT Int'l Appl. . |
| 729211 | 4/1980 | U.S.S.R. . |
| 925969 | 5/1982 | U.S.S.R. . |
| 1469930 | 4/1987 | United Kingdom . |

OTHER PUBLICATIONS

"Beacon Gas-Conversion Process yelds Useful Carbon Materials" (R&D-Jan. 1987).
Endo, "Grow Carbon Fibers in the Vapor Phase", Chemtech, pp. 568-576 (Sep. 1988).
Tibbetts et al., SAMPE Journal (Sep./Oct. 1986), pp. 30-35.

*Primary Examiner*—Mark L. Bell
*Assistant Examiner*—Deborah Jones
*Attorney, Agent, or Firm*—Curtis, Morris & Safford

[57] ABSTRACT

A crosslinked thermoplastic elastomer composition obtained by mixing 100 weight parts of at least one type of thermoplastic elastomer, 0–200 weight parts of a rubber-like polymer, and 1–50 weight parts of ultra fine carbon fibrils whose diameter is 3.5–70 nm and whose aspect ratio is greater than 5 against 100 weight parts of the combined mixture of the aforementioned elastomer and rubber like polymer.

12 Claims, No Drawings

THERMOPLASTIC ELASTOMER COMPOUNDS

This application is a continuation of application Ser. No. 07/511,780, filed Apr. 18, 1990, now abandoned.

BACKGROUND OF THE INVENTION

The present invention relates to a polymer compound which contains a thermoplastic elastomer, or more specifically it relates to a thermoplastic elastomer compound with superior reinforcing characteristics as well as with either electrical conductivity or electrical insulating characteristics, produced by compounding ultra-fine carbon fibrils.

Recently, there is an increasing demand for electrically conductive or electrically insulating polymer materials used in electronic parts or semiconductive layers of power cables for the purpose of preventing static generation or interferences from external electromagnetic waves.

Conventionally, the method of filling electrically conductive carbon-black in a matrix polymer has been used as a way to add electrically conductive characteristics to a rubber. Although it achieves the desired electrical conductivity, the method fails to reinforce the strength of the material. On the other hand, the system of adding reinforcing type carbon-black results in the desired reinforcing effect when as much as 30–100 phr is filled (wt. parts against 100 wt. parts of rubber). However, the system is absolutely ineffective in increasing electrical conductivity.

Incidentally, both reinforcing and electrically conductive effects can be obtained by compounding chopped carbon fibers which possess both of these effects. However, such fiber is not necessarily a satisfactory reinforcing material because of its poor molding characteristics, the poor surface appearance of the molded products, and anisotropic nature. Moreover, its reinforcing effects depend on the processing conditions since its short fibers break during the processing.

Recently, ultra-fine carbon fibrils became available, and the possibility of compounding such carbon fibrils in a resin or rubber-like polymer has been discussed. However it has been difficult to obtain a material with well balanced properties including suitable hardness and superior elasticity.

The present invention intends to offer a thermoplastic elastomer compound which possesses a reinforcing effect and both electrically conductive and electrically insulating effects, as well as balanced strength and elasticity.

DETAILED DESCRIPTION OF THE INVENTION

The inventors of the present invention studied the method for compounding thermoplastic elastomers, and discovered that compounding with certain types of ultra fine carbon fibrils gave a compound with the above mentioned characteristics and well balanced properties. Hence, the present invention was achieved.

In other words, the present invention offers a cross-linked type thermoplastic elastomer compound which is obtained by mixing at least one type of thermoplastic elastomer (100 wt. parts), rubber like polymer (0–200 wt. parts), and ultra-fine carbon fibrils, whose diameter is 3.5–70nm and aspect ratio is greater than 5, 1–50 wt. parts against 100 wt. parts of the combined mixture of the aforementioned elastomer and rubber-like polymer.

The ultra fine carbon fibrils used in the present invention have practically uniform diameter of 3.5–70 nm, or more preferably 7–25 nm, and length greater about 5 times or more, preferably 50–10,000 times, or most preferably 100–5,000 times the diameter. In addition, they are practically annular shaped separation-type carbon fibrils which are characterized by the outer zone composed of many continuous layers of regularly aligned carbon atoms, and a separate inner core zone. The aforementioned layered zone and the core are practically concentric against the cylindrical center line of the fibrils. It is desirable that the entire fibrils do not contain any thermal carbon film.

The inner core of the fibrils can be hollow or filled with carbon atoms with the characteristics of graphite whose alignment is less regular compared to the regularly aligned carbon atoms in the outer layer zone.

Desirable carbon fibrils have a 25.5°–26.3° diffraction angle and 3.38–3.50 angstrom spacing between graphite layers. A spacing below 3.38 angstroms results in a greater anisotropic nature, while a spacing greater than 3.50 angstroms results in poor electrical conductivity.

The ultra-fine carbon fibrils used in the present invention can be produced by contacting metal containing particles with a carbon containing gaseous organic compound at a temperature about 850° C.–1200° C. In this case, the dry weight ratio between the carbon containing organic compound and the metal containing particles should be at least 100:1.

The metal containing particles and the carbon-containing organic compound are contacted in the presence of a compound such as $CO_2$, $H_2$, or $H_2O$, which forms gaseous products when it reacts with carbon.

Listed below are examples of the carbon-containing gaseous organic compound; aromatic hydrocarbons such as benzene, toluene, xylene, cumene, ethylbenzene, naphthalene, phenanthrene, anthracene, or a mixture of these compounds; aliphatic hydrocarbons such as methane, ethane, propane, ethylene, propylene, acetylene, or a mixture of these compounds; oxyqen containing hydrocarbons such as formaldehyde, acetaldehyde, acetone, methanol, ethanol, or a mixture of these compounds; or carbon monoxide.

Desirable metal-containing particles are iron, cobalt, or nickel-containing particles whose diameter is in the range of about 3.5–70 nm.

These particles can be carried on a chemically compatible, heat resistant carrier such as alumina, or silicate which contains carbon or aluminum silicate.

In a specific example, the surface of metal-containing particles is independently heated to about 850°–1800° C. by electromagnetic radiation. The temperature of the metal-containing particles should be higher than the temperature of the carbon-containing gaseous compound.

In a particular example, iron-containing particles as metal-containing particles and benzene as a carbon-containing organic compound are contacted under pressure at about 1/10–10 atm. for a period of about 10–180 minutes. The reaction temperature is 900°–1150° C., and the ratio between the carbon containing organic compound and the iron-containing particles is greater than about 1,000:1. The contacting can be performed in the presence of gaseous hydrogen. Further, the iron containing particles can be carried on a chemically compatible and heat resistant carrier such as alumina or carbon.

The carbon fibrils produced by the procedures described above have a practically uniform diameter, and are desirable for attaining the reinforcing effects and electrical conductivity.

Incidentally, the carbon fibrils produced by the above procedures tend to form flocks, and it is not advisable to use them as they are since they have poor dispersion, which is likely to mar the appearance of a molded product. Therefore, it is desirable to break the flocks before using them by treating them with a mechanical breaker such as a vibration mill or ball mill, or by ultrasonic treatment in the presence of water or solvent, or a combination of these methods.

In the present invention, the aforementioned ultra-fine carbon fibrils are compounded in a thermoplastic elastomer in order to obtain an elastomer compound with various superior characteristics.

The aforementioned special ultra-fine carbon fibrils have a relatively large surface area, and thus impart a greater electrical conductivity as compared to conventionally used electrically conductive carbon materials. Because of their relatively large surface area, interaction with the matrix of the resin becomes greater when the fibrils are combined with a polymer which has high affinity with the fibrils, resulting in a greater reinforcing effect as compared to the conventional carbon fiber reinforced polymer compounds. Further, since a greater resilience can be obtained as the fiber becomes finer, the possibility of breaking the reinforcing fiber during the processing is eliminated, resulting in superior characteristics and high reproducibility of the molded products.

As it is discussed above, the present invention offers an ultra-fine carbon fibril compounded elastomer compound having reinforcing effect and both electrical conductivity and electrical insulating effects, which could not have been obtained with the conventional carbon materials.

Listed below are examples of thermoplastic elastomers used in the present invention: polyolefin type elastomers; styrene-type elastomers such as styrene-butadiene styrene block co-polymer or styrene-isoprene-styrene block co-polymer or their hydrogenated forms; PVC-type elastomers; urethane type elastomers; polyester-type elastomers; polyamide-type elastomers; polybutadiene type thermoplastic elastomers such as 1,2 polybutadiene resins or trans-1,4-polybutadiene; polyethylene-type elastomers such as methylcarboxylate-polyethylene co-polymers, ethylene vinylacetate co-polymers, and ethylene-ethylacrylate co polymers; chlorinated polyethylene; fluorine type thermoplastic elastomer, etc. Among these materials, 1,2 polybutadiene resins, styrene type elastomers, and hydrogenated styrene type elastomers are desirable in view of obtaining a superior reinforcing effect, with 1,2 polybutadiene being the most desirable.

As the aforementioned 1,2-polybutadiene resins, polymers which contain more than 30%, or preferably more than 50% of 1,2 vinyl bondings are desirable in view of their mechanical characteristics. Their average molecular weights are greater than 1,000, or preferably greater than 10,000 in view of the green-strength of the non crosslinked polymer.

In addition, in order to obtain both the desired reinforcing effect and electrical conductivity, the 1,2-polybutadiene resin ought to have a suitable degree of crystallization, or specifically 10–70% crystallization. When the degree of crystallization is below 10%, the green-strength of the obtained compound becomes low, while the degree of crystallization above 70% creates processing problems due to the high temperature required for processing 1,2-polybutadiene resin.

In the compounds covered by the present invention, the 1,2-polybutadiene resin can be used by itself; or more than two kinds of 1,2-polybutadiene resins with different 1,2 structures or different degrees of crystallization may be combined; or the resins may be blended with other rubber-like polymers.

Further, the compounds covered by the present invention can be obtained by blending rubber-like cis-1,4-polybutadiene, styrene-butadiene co-polymer rubber, ethylene-propylene, di-functional monomer rubber ("EPDM") chloroprene rubber, butyl rubber, halogenated butyl rubber, acrylonitrile-butadiene co-polymer rubber, acrylic rubber, etc. ("non-thermoplastic elastomer rubbers") with the aforementioned thermoplastic elastomers depending on the application.

The blending ratio of these non-thermoplastic elastomer rubbers against the thermoplastic elastomer should be less than 200 wt. parts per 100 wt. parts of the thermoplastic elastomer. When more than 200 wt. parts of non-thermoplastic elastomer material is blended, the reinforcing effect associated with the superior affinity between the ultra-fine carbon fibrils and the thermoplastic elastomer cannot be maintained.

The aforementioned thermoplastic elastomer or its blended mixture with a rubber-like material can be cured in the crosslinking processes commonly used in the rubber industry, by adding sulfur for vulcanization, vulcanization accelerator, vulcanization aid and thermosetting resin such as phenol resin for thermosetting resins, hardening catalyst such as Lewis acid, peroxide for crosslinking peroxide compounds, and co-crosslinking agent (multi-functional methacrylate, divinyl benzene, dimaleimide, etc.).

Some examples of the aforementioned vulcanization accelerators include ammonium aldehydes, aminoaldehydes, guanidines, thioureas, thiazols, dithiocarbamates, xanthogenes, thiurams, etc. Examples of vulcanization aids include stearic acid, oleic acid, lauric acid, zinc white, litharge, magnesium oxide, zinc-stearate, etc.

The effects intended in the present invention can be obtained by compounding 1–50 wt. parts, or more preferably 2–30 wt. parts, or most preferably 3–20 wt. parts of the ultra-fine carbon fibrils used in the present invention against 100 wt. parts of the combined mixture of the aforementioned thermoplastic elastomer and the aforementioned non-thermoplastic elastomer. The reinforcing effects are not sufficient when the amount of ultra-fine carbon fibrils is below 1 wt. part, while the amount should not exceed 50 wt. parts so that the superior processing characteristic of the elastomer specific to 1,2-polybutadiene may not be lost.

The compounds covered by the present invention are prepared by using known mixing and processing devices such as a kneader, Bambary mixer, plastomill, or rolls.

Further, desired shapes can be formed by using any known method such as extrusion molding, press molding, etc.

Aside from the ultra-fine carbon fibrils, particle type reinforcing materials such as carbon black or silica fillers, or inorganic and organic reinforcing fibers such as glass fiber, aramid fiber, or carbon fiber can be blended in the compounds covered by the present invention. Antioxidants, stabilizers, processing aids, and flame retardants may also be blended.

The thermoplastic elastomers compounded with ultra-fine carbon fibrils covered by the present invention possess unique characteristics which cannot be attained by other resins and rubber like materials, as well as superior reinforcing effects and electrical conductivity compared to compounds with carbon fibers conventionally used for imparting electrical conductivity. The compounds covered by the present invention are elastomers which result in less noise due to static generation, and feature superior mechanical characteristics. Therefore, they are suitable as a material for electrical parts, electronic parts, housing for OA machineries, structural materials, electrically conductive floors, electrically insulating shoes, semiconductive layers of power cables, etc.

EXAMPLES

The present invention will be explained in further detail by application examples.

Application Examples 1-3

Ultra fine carbon fibrils (diameter: 30nm, length: 30 microns, phase interval measured by wide angle X-ray diffraction: 3.45 angstroms, diffraction angle:26.8° ) were mixed with a 1,2 polybutadiene type thermoplastic elastomer (Nippon Synthetic Rubber Co., RB 810) at 100/5, 100/10, and 100/15 mixing ratios by using a kneader at 140° C. for a period of 10 minutes. After the kneading, sheets were formed by and pressed to 2 mm thick by a press mold (140° C.×5 min.). A set of rolls, Dumbell type (JIS #3) test pieces were then punched out in the direction of roll alignment as well as in the perpendicular direction.

Tensile stress at 100% elongation ($M_{100}$) and at 300% elongation ($E_b$) tensile strength ($T_b$), and breaking elongation ($E_b$) of the obtained test pieces were measured by a tensile strength tester. JIS A hardness, Vicat softening temperature, and volumetric resistivity were also measured.

Further, appearance of the molded parts was visually observed in order to evaluate the surface conditions. Product parts with superior surface gloss and a smooth surface without any exposed carbon material were classified as 0, while product parts with poor surface gloss or with an irregular surface with exposed carbon material were classified as X.

Results are shown in Table 1.

Reference Example 1

The 1,2-polybutadiene used in Application Example 1 was press molded alone, and test pieces were prepared in the same manner as in Application Examples 1-3. Results obtained by the similar tests are shown in Table 1.

Reference Examples 2-4

Test pieces were prepared in the same manner as Application Examples 1-3 using electrically conductive carbon black (Lion Akuzo KK, Kichen Black EC-DJ 500) in place of the ultra-fine carbon fibrils used in Application Examples 1-3, and similar tests were conducted. Results are shown in Table 1.

Reference Examples 5-7

Test pieces were prepared in the same manner as Application Examples 1-3 using reinforcing carbon black (HAF CB) (Mitsubishi Kasei K.K., Diablack) in place of the ultra fine carbon fibrils used in Application Examples 1-3, and similar tests were conducted. Results are shown in Table 1.

Reference Examples 8-10

Test pieces were prepared in the same manner as Application Examples 1-3 using carbon fiber chopped into 10 mm length (Toray Industries, HTA W1000) in place of the ultra-fine carbon fibrils used in Application Examples 1-3, and similar tests were conducted. Results are shown in Table 1.

In all examples, stress strain analyses were conducted not only in the roll alignment direction but also in the perpendicular direction for the systems in which 15 wt. parts of carbon reinforcing material or electrical conductivity imparting additive (called reinforcing filler hereinafter) against 100 wt. parts of 1,2-polybutadiene was blended, in order to study anisotropic characteristics of the products.

As to the effects of compounding ultra-fine carbon fibrils in 1,2-polybutadiene in the compounds covered by the present invention, increases in $M_{100}$, $M_{300}$ and $T_b$, which represented the strength characteristics, were significant compared to other systems.

With regard to the volumetric resistivity, the compound system with carbon fibers showed the smallest resistivity. However, this system had poor product appearance and showed anisotropic strength characteristics. In other words, it was confirmed that the compounds covered by the present invention showed well balanced characteristics and high performance in strength characteristics such as tensile stress and tensile strength, and electrically conductive characteristics.

Application Examples 4-6

Zinc-white (3 wt. parts), stearic acid (1 wt. part), dibenzothiazil-disulfide, as a vulcanization accelerator (1.5 wt. parts), and tetramethyl-thiuramdisulfide (0.55 wt. parts) were added against 100 wt. parts of 1,2-polybutadiene to the compounds obtained in Application Examples 1-3, and they were processed in the same manner as Application Examples 1-3. The obtained products were press-vulcanized at 160° C. for a period of 20 minutes. Incidentally, these conditions were confirmed to be the optimum vulcanization conditions based on the measurement by the JSR Curastometer (Nippon Synthetic Rubber Co.) vulcanization tester.

The test pieces for the tensile test were punched out in the direction of roll alignment used for the sheet formation as in Application Examples 1-3. Incidentally, the tensile test was conducted in the direction perpendicular to the roll alignment in the case of compound systems with 15 wt. parts of a filler reinforcement. The tests included $M_{100}$, $M_{300}$, $T_b$, and $E_b$ by a tensile tester, hardness by the JIA A method, measurement of volumetric resistivity, and visual evaluation of appearance. Results are shown in Table 2.

Reference Example 11

Following the same procedure used in Application Example 4, a vulcanized compound was produced from a 1,2 polybutadiene single system used in Reference Example 1. Results are shown in Table 2.

Reference Examples 12-14

These are examples of vulcanized systems which correspond to Reference Examples 5-7, produced by Kichen black following the same procedure used in Application Examples 4-6. Results are shown in Table 2.

Reference Examples 15-17

These are examples of vulcanized systems which correspond to Reference Examples 5-7, produced by HAF carbon-black following the same procedure used in Application Examples 4-6. Results are shown in Table 2.

The vulcanized compounds obtained by Application Examples 4-6 had an excellent appearance as well as excellent reinforcing effects and electrically conductivity imparting effect, confirming the superiority of the compounds produced by the present invention.

Application Examples 7-9

Sheets where prepared following the procedures used in Application Example 3, but using styrene-butadiene-styrene block co-polymer (SBS) (Nippon Synthetic Rubber, Co., TR-1000, contains 50 phr extension oil), styrene-(ethylene-butylene)-styrene block co-polymer (SEBS) (Shell Ltd., Krayton G1650), ethylene-methacrylate co polymer (EMA) (Mitsui Dupont Chemical, Co., Nucler 599) were respectively used in place of 1,2-polybutadiene used in Application Example 3. Test results are shown in Table 3.

Reference Examples 18-20

Sheets were prepared following the procedures used in Application Examples 7-9, but using reinforcing type carbon black (HAH CB) in place of the ultra-fine carbon fibrils used in Application Examples 7-9, and tested. Results are shown in Table 3.

Reference Example 21

Test pieces were prepared following the procedures used in Application Example 3, but using cis-1,4-polybutadiene (BR) (Nippon Synthetic Rubber, JSR BR01) in place of 1,2-polybutadiene used in Application Example 3. Ultra fine carbon fibrils were added, then the following were mixed; 3 wt. parts of zinc-white as vulcanization accelerator aid, 5 wt. parts of propyl oil, 2 wt. parts of stearic acid, 0.8 wt. parts each of N-phenyl-N'-isopropyl-p-phenylenediamine as anti-aging agent, N-cyclohexyl-2-benzothiazilsulfamide as vulcanization accelerator, and 1.75 wt. parts of sulfur against 100 wt. parts of polybutadiene. The mixture was press-vulcanized at 45° C. for a period of 30 minutes. The results are shown in Table 3.

Reference Example 22

Test pieces were prepared in the same manner as Reference Example 21, with filling reinforcing type carbon black (HAF CB) used in place of the ultra-fine carbon fibrils used in Reference Example 21 and similar tests were conducted. The results are shown in Table 3. 26.

Other embodiments are within the following claims.

TABLE 1

| | Applicat. Example 1 | Applicat. Example 2 | Applicat. Example 3 | | Reference Example 1 | Reference Example 2 | Reference Example 3 | Reference Example 4 | |
|---|---|---|---|---|---|---|---|---|---|
| Type & Qty. of reinforcing filler (phr) | Ultra-fine carbon fibrils 5 | Ultra-fine carbon fibrils 10 | Ultra-fine carbon fibrils 15 | | EC-DJ500 0 | EC-DJ500 5 | EC-DJ500 10 | EC-DJ500 15 | |
| | | | Roll alignment direction | Perpendicular direction | | | | Roll alignment direction | Perpendicular direction |
| 100% Tensile Stress $M_{100}$ (kg/cm$^2$) | 55 | 82 | 106 | 88 | 33 | 39 | 47 | 55 | 53 |
| 300% Tensile Stress $M_{300}$ (kg/cm$^2$) | 72 | 96 | — | — | 42 | 51 | 61 | 68 | 66 |
| Tensile Strength $T_b$ (kg/cm$^2$) | 72 | 96 | 121 | 108 | 69 | 66 | 66 | 69 | 67 |
| Breaking Elongation $E^b$ (%) | 440 | 300 | 250 | 300 | 820 | 760 | 570 | 450 | 470 |
| Vicat Softening Temp. (°C.) | 42 | 43 | 45 | | 45 | 44 | 45 | 46 | |
| Volumetric Resistivity (Ohm. cm) | $2.2 \times 10^9$ | $5.4 \times 10^5$ | $7.3 \times 10^4$ | | $2.0 \times 10^{17}$ | $1.8 \times 10^{12}$ | $1.2 \times 10^9$ | $3.5 \times 10^7$ | |
| Hardness (JIS A) | 88 | 90 | 92 | | 79 | 82 | 83 | 87 | |
| Appearance | 0 | 0 | 0 | | 0 | 0 | 0 | 0 | |

| | Reference Example 5 | Reference Example 6 | Reference Example 7 | | Reference Example 8 | Reference Example 9 | Reference Example 10 | |
|---|---|---|---|---|---|---|---|---|
| Type & Qty. of reinforcing filler (phr) | HAF CB 5 | HAF CB 10 | HAF CB 15 | | HTA W1000 5 | HTA W1000 10 | HTA W1000 15 | |
| | | | Roll alignment direction | Perpendicular direction | | | Roll alignment direction | Perpendicular direction |
| 100% Tensile Stress $M_{100}$ (kg/cm$^2$) | 36 | 38 | 41 | 39 | 42 | 47 | — | 35 |
| 300% Tensile Stress $M_{300}$ | 46 | 51 | 59 | 56 | 45 | 48 | — | 40 |

TABLE 1-continued

|  |  |  |  |  |  |  |  |  |
|---|---|---|---|---|---|---|---|---|
| (kg/cm$^2$) |  |  |  |  |  |  |  |  |
| Tensile Strength $T_b$ (kg/cm$^2$) | 73 | 71 | 73 | 67 | 63 | 59 | 79 | 53 |
| Breaking Elongation $E^b$ (%) | 830 | 710 | 710 | 63 | 690 | 550 | 70 | 600 |
| Vicat Softening Temp. (°C.) | 38 | 38 | 39 |  | 43 | 42 |  | 42 |
| Volumetric Resistivity (Ohm. cm) | 7.8 × 10$^{16}$ | 7.0 × 10$^{16}$ | 6.2 × 10$^{16}$ |  | 7.5 × 10$^7$ | 3 × 10$^4$ |  | 3.5 × 10$^2$ |
| Hardness (JIS A) | 85 | 86 | 86 |  | 85 | 86 |  | 88 |
| Appearance | 0 | 0 | 0 |  | 0 | X |  | X |

TABLE 2

|  | Applicat. Example 4 | Applicat. Example 5 | Applicat. Example 6 | | Reference Example 11 | Reference Example 12 | Reference Example 13 |
|---|---|---|---|---|---|---|---|
| Type & Qty. of reinforcing filler (phr) | Ultra-fine carbon fibrils 5 | Ultra-fine carbon fibrils 10 | Ultra-fine carbon fibrils 15 | | 0 | EC-DJ500 5 | EC-DJ500 10 |
| | | | Roll alignment direction | Perpendicular direction | | | |
| 100% Tensile Stress $M_{100}$ (kg/cm$^2$) | 65 | 102 | 145 | 102 | 30 | 42 | 52 |
| 300% Tensile Stress $M_{300}$ (kg/cm$^2$) | — | — | — | — | 59 | 90 | 108 |
| Tensile Strength $T_b$ (kg/cm$^2$) | 115 | 158 | 195 | 172 | 83 | 114 | 151 |
| Breaking Elongation $E^b$ (%) | 290 | 230 | 180 | 210 | 370 | 360 | 400 |
| Volumetric Resistivity (Ohm. cm) | 1.8 × 10$^4$ | 3.0 × 10$^3$ | 90 | | 2.3 × 10$^{16}$ | 1.8 × 10$^7$ | 1.1 × 10$^3$ |
| Hardness (JIS A) | 80 | 85 | 90 | | 74 | 80 | 84 |
| Appearance | 0 | 0 | 0 | | 0 | 0 | 0 |

|  | Reference Example 14 | | Reference Example 15 | Reference Example 16 | Reference Example 17 | |
|---|---|---|---|---|---|---|
| Type & Qty. of reinforcing filler (phr) | EC-DJ500 15 | | HAF CB 5 | HAF CB 10 | HAF CB 15 | |
| | Roll alignment direction | Perpendicular direction | | | Roll alignment direction | Perpendicular direction |
| 100% Tensile Stress $M_{100}$ (kg/cm$^2$) | 60 | 59 | 38 | 40 | 47 | 47 |
| 300% Tensile Stress $M_{300}$ (kg/cm$^2$) | 128 | 125 | 86 | 106 | — | 132 |
| Tensile Strength $T_b$ (kg/cm$^2$) | 160 | 145 | 97 | 111 | 125 | 132 |
| Breaking Elongation $E^b$ (%) | 390 | 400 | 320 | 310 | 290 | 300 |
| Volumetric Resistivity (Ohm. cm) | | 25 | 9.7 × 10$^{15}$ | 8.2 × 10$^{15}$ | 8.0 × 10$^{15}$ | |
| Hardness (JIS A) | | 87 | 79 | 80 | 83 | |
| Appearance | | 0 | 0 | 0 | 0 | |

TABLE 3

|  | Applicat. Example 7 | Applicat. Example 8 | Applicat. Example 9 | Reference Example 18 | Reference Example 19 | Reference Example 20 | Reference Example 21 | Reference Example 22 |
|---|---|---|---|---|---|---|---|---|
| Polymer Mater. | SBS | SEBS | EHA | SBS | SEBS | EHA | BR | BR |
| Type & Qty. of reinforcing filler (phr) | Ultra-fine carbon fibrils 5 | Ultra-fine carbon fibrils 10 | Ultra-fine carbon fibrils 15 | HAF CB 15 | HAF CB 15 | HAF CB 15 | Ultra-fine carbon fibrils 15 | HAF CB 15 |
| 100% Tensile Stress $M_{100}$ (kg/cm$^2$) | 57 | 104 | 95 | 24 | 27 | 76 | 44 | 10 |
| 300% Tensile Stress $M_{300}$ (kg/cm$^2$) | 85 | 208 | 145 | 42 | 178 | 95 | 82 | 15 |
| Tensile Strength $T_b$ (kg/cm$^2$) | 236 | 281 | 180 | 185 | 242 | 134 | 134 | 38 |
| Breaking Elongation $E^b$ (%) | 560 | 350 | 360 | 750 | 400 | 450 | 450 | 590 |
| Volumetric Resistivity (Ohm. cm) | 75 | 50 | 20 | $4.6 \times 10^{15}$ | $6.7 \times 10^{15}$ | $1.4 \times 10^{11}$ | 85 | $7.2 \times 10^{14}$ |
| Hardness (JIS A) | 84 | (Shoa D) 59 | (Shoa D) 90 | 72 | (Shoa D) 45 | (Shoa D) 65 | 60 | 44 |
| Appearance | 0 | 0 | 0 | 0 | 0 | 0 | 0 | 0 |

We claim:

1. A crosslinked thermoplastic elastomer composition comprising:
   (a) 100 weight parts of at least one thermoplastic elastomer;
   (b) Greater than 0 and less than 200 weight parts of a non-thermoplastic elastomer rubber per 100 weight parts of the thermoplastic elastomer, and
   (c) 1-50 weight parts of ultra-fine carbon fibrils whose diameter is 3.5-70 nm and whose aspect ratio is greater than 5 per 100 weight parts of the combined mixture of said thermoplastic elastomer and said rubber.

2. The composition of claim 1 wherein the diameter of said fibrils is 7-25 nm.

3. The composition of claim 1 wherein said thermoplastic elastomer is selected from the group consisting of 1,2-polybutadiene, styrene, butadiene-styrene block copolymer or the hydrogenated form thereof, and styrene-isoprene-styrene block copolymer or the hydrogenated form thereof.

4. The composition of claim 2 wherein the 1,2-vinyl content of said 1,2-polybutadiene is at least 30%.

5. The composition of claim 2 wherein the molecular weight of said 1,2-polybutadiene is at least 1,000.

6. The composition of claim 2 wherein the degree of crystallization of said 1,2-polybutadiene is 10-70%.

7. The composition of claim 1 wherein said rubber comprises natural rubber, polyisoprene, cis-1,4-polybutadiene, styrene-butadiene copolymer rubber ethylene-propylene di-functional monomer rubber, chloroprene rubber, butyl rubber, halogenated butyl rubber, acrylonitrile-butadiene copolymer rubber, and acrylic rubber.

8. The composition of claim 1 wherein the amount of said carbon fibrils is 2-30 parts per 100 weight parts of the combined mixture of said thermoplastic elastomer and said rubber.

9. The composition of claim 1 wherein the amount of said carbon fibrils is 3-20 parts per 100 weight parts of the combined mixture of said thermoplastic elastomer and said rubber.

10. The composition of claim 1 wherein said carbon fibrils comprise essentially cylindrical discrete carbon fibrils having an outer region of multiple essentially continuous layers of ordered carbon atoms and a distinct inner core region, each of the layers and core disposed substantially about the cylindrical axis of the fibril.

11. The composition of claim 10 wherein said fibrils are substantially free of a film of pyrolytically deposited thermal carbon.

12. The composition of claim 5, wherein the molecular weight of said 1,2-polybutadiene is at least 10,000.

* * * * *